United States Patent [19]

Honma et al.

[11] Patent Number: 4,581,578

[45] Date of Patent: Apr. 8, 1986

[54] APPARATUS FOR MEASURING CARRIER LIFETIMES OF A SEMICONDUCTOR WAFER

[75] Inventors: Noriaki Honma; Chusuke Munakata, both of Nishitama, Japan

[73] Assignee: Hitachi, Ltd., Tokyo, Japan

[21] Appl. No.: 575,691

[22] Filed: Jan. 31, 1984

[30] Foreign Application Priority Data

Feb. 1, 1983 [JP] Japan .................................. 58-15174

[51] Int. Cl.[4] ............................................. G01R 31/26
[52] U.S. Cl. ............................. 324/158 D; 324/158 R
[58] Field of Search ....................... 324/158 R, 158 D; 29/574

[56] References Cited

U.S. PATENT DOCUMENTS 4,122,383 10/1978 von Roos ....................... 324/158 D

FOREIGN PATENT DOCUMENTS 52-66373 6/1977 Japan ..................................... 29/574

OTHER PUBLICATIONS

Munakata, C. et al., "Non-Destructive Method of Observing Inhomogeneities in p-n Junctions with a Chopped Photon Beam", Japanese J. Appl. Phys., vol. 20, No. 2, Feb. 1981, pp. L137-L140.

Primary Examiner—Stewart J. Levy
Assistant Examiner—Stephen M. Baker
Attorney, Agent, or Firm—Antonelli, Terry & Wands

[57] ABSTRACT

A carrier lifetime measuring apparatus according to the present invention has a construction wherein a first photon beam of a wavelength capable of rendering the optical absorption coefficient of a semiconductor sample very small when the semiconductor sample having a potential barrier in the vicinity of its surface is irradiated with the radiation, and a second photon beam of a wavelength capable of rendering the optical absorption coefficient very large are respectively chopped to alternately irradiate the identical place of the semiconductor sample with the chopped beams; first and second photovoltages which are generated in the semiconductor sample by these photon beams are detected by capacitance coupling; and the ratio between a first amplitude variation and a second amplitude variation is obtained from the amplitudes of the detected photovoltages; thereby to evaluate a minority carrier lifetime in the semiconductor sample.

2 Claims, 7 Drawing Figures

APPARATUS FOR MEASURING CARRIER LIFETIMES OF A SEMICONDUCTOR WAFER

BACKGROUND OF THE INVENTION

The present invention relates to improvements in a carrier lifetime measuring apparatus which measures a minority carrier (current carrier) lifetime within a semiconductor non-contactingly and nondestructively on the basis of the frequency dependence of a photovoltage.

It is well known that the minority carrier lifetime of a semiconductor is an important factor pertinent to the electrical characteristics of a semiconductor device. Therefore, the non-contacting and nondestructive inspection of the minority carrier lifetime is important in the enhancement of yield percentage in a manufacturing process.

The inventors have previously proposed a carrier lifetime measuring apparatus which measures minority carrier lifetime within a semiconductor nondestructively from the bending point of the frequency dependence of a photovoltage (Japanese Patent Application No. 57-87944). In the proposed apparatus, a p-Si wafer having a p-n junction, for example, is irradiated with radiation which has energy equivalent to or somewhat greater than the band gap of Si (in the case of Si, infrared radiation at wavelengths of 1–1.15 $\mu$m) and which is chopped, to generate an alternating photovoltage, and this photovoltage $V_{ph}$ is detected through capacitance coupling which employs a transparent electrode, whereby the frequency dependence of the photovoltage stated above is measured. Thus, the apparatus makes it possible to nondestructively measure the minority carrier lifetime within the sample wafer without forming any electrode on the sample wafer.

The lifetime $\tau$ of carriers at the irradiated position of the sample wafer is obtained as $\tau = 1/(2\pi f_0)$ from the frequency $f_0$ of that bending point based on the carrier lifetime which appears in the frequency dependence of the photovoltage when this frequency dependence is measured. The photovoltage $V_{ph}$ becomes a constant value at frequencies lower than the cutoff frequency $f_c$ of the junction. In contrast, it varies in proportion of $f^{-1}$ for frequencies exceeding $f_c$ (point A in FIG. 1A), and it varies in proportion to $f^{-3/2}$ for frequencies exceeding $f_0$ (point B in the figure). Accordingly, when the frequency dependence of the photovoltage $V_{ph}$ is indicated by coordinates both the axes of which are logarithmically represented, as shown in FIG. 1A, the frequency at the time at which the characteristic curve changes from a gradient of 45 degrees to a gradient of 56 degrees is found as the frequency $f_0$.

The proposed apparatus, however, still involves problems as described below. Although the bending point of 45 degrees→56 degrees is a property often observed in cases of the p-n junction etc., the manifestation of the influence of the time constants of interface states or traps or surface states or traps is often observed in, for example, p-type Si bearing an oxide film or n-type Si subjected to an alkali surface treatment. The frequency dependence of the photovoltage in such case is no longer ensured to become a curve decreasing at the inclination angle of 45 degrees for $f \geq f_c$, as seen from FIG. 1B. In addition, the appearance of a new bending point is sometimes observed. Accordingly, it is difficult to obtain $f_0$ as to such samples, and there is the problem that the carrier lifetime $\tau$ cannot be measured from the bending point of the frequency dependence. Further, changes in an interelectrode capacitance, the input impedance of a photovoltage detector, etc. affect the frequency dependence of the photovoltage. Therefore, whether or not the observed bending point is truly based on the minority carrier lifetime needs to be confirmed by, for example, the photoconductivity decay method which requires the formation of electrodes. This signifies the problem that, with only the bending point of the frequency dependence of the photovoltage, the measured results lacks reliability.

SUMMARY OF THE INVENTION

An object of the present invention is to provide a carrier lifetime measuring apparatus which eliminates influence on a frequency dependence by an interface state or trap in a sample and changes in circuit constants included in a measuring system, thereby making it possible to detect only a change based on a minority carrier lifetime.

The salient feature of the present invention consists in a construction wherein a first photon beam of a wavelength which can render the optical absorption coefficient of a semiconductor sample very small when the semiconductor sample having a potential barrier in the vicinity of its surface is irradiated with the radiation, and a second photon beam of a wavelength which can render the optical absorption coefficient very large are respectively chopped to alternately irradiate the identical place of the semiconductor sample with the chopped beams; first and second photovoltages which are generated in the semiconductor sample by these photon beams are detected by capacitance coupling; and the ratio between a first amplitude variation and a second amplitude variation is obtained from the amplitudes of the detected photovoltages; thereby to evaluate a minority carrier lifetime in the semiconductor sample.

DETAILED DESCRIPTION OF THE PREFERRED EMBODIMENTS

First of all, the fundamental idea in the present invention will be described.

Figure 2A:
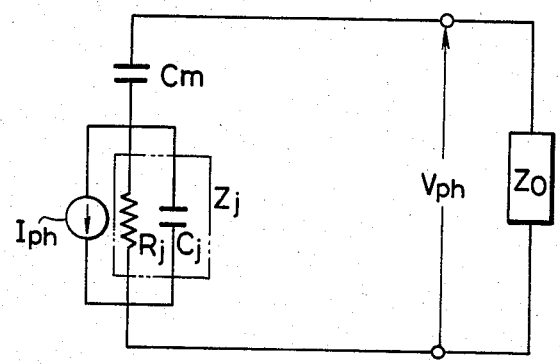
FIGS. 2A and 2B are diagrams of equivalent circuits at the measurements of photovoltages, in which FIG. 2A corresponds to the absence of the influence of a surface state or trap and FIG. 2B the presence thereof.
Figure 2B:
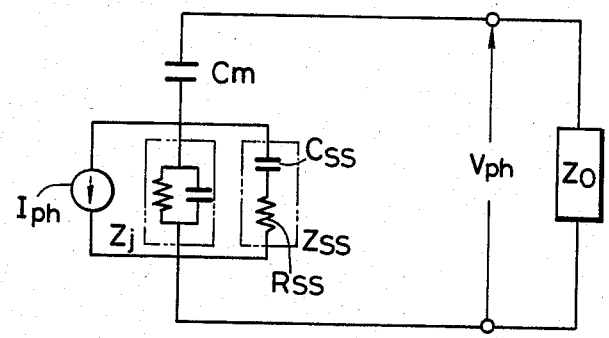

When a semiconductor sample having a potential barrier in the vicinity of its surface is irradiated with light, a photocurrent flows within the semiconductor owing to the photovoltaic effect, and a photovoltage develops across the sample. When the light is chopped at a frequency f, both the photocurrent and the photovoltage become alternating. By disposing an electric capacitor made of a transparent electrode for the sample surface, accordingly, the photovoltage can be measured by an A.C. voltmeter or the like without contact with the sample surface. The basic electrical equivalent circuits of such measuring system are shown in FIGS. 2A and 2B. FIG. 2A corresponds to the absence of the influence of surface states or traps, while FIG. 2B corresponds to the presence thereof.

A voltage $V_0$ measured by the circuit of FIG. 2A or 2B is expressed by:

$$V_0 = Z \cdot I_{ph} \tag{1}$$

Here, $I_{ph}$ denotes a photocurrent, and Z an impedance represented by the following equation:

$$Z = \frac{Z_O \cdot Z_j}{Z_O + Z_j + 1/j 2\pi f C_m} \tag{2}$$

Here, $j=\sqrt{-1}$ holds, $Z_0$ denotes the input impedance of an A.C. voltmeter, $Z_j$ denotes the junction impedance of a semiconductor sample, and $C_m$ denotes a coupling capacitance formed of a transparent electrode. From Equation (1), the frequency dependence of $V_0$ is determined by the frequency dependence of $Z$ and that of $I_{ph}$. The frequency dependence of $I_{ph}$ is expressed by the following equation:

$$I_{ph} = e \cdot \Phi \cdot (1 - \textcircled{R}) \cdot \frac{\alpha L}{\alpha L + 1} \cdot S \tag{3}$$

Here, e denotes the unit charge, $\Phi$ the number of photons per unit area and unit time, O the optical reflection coefficient, $\alpha$ the optical absorption coefficient, and $\textcircled{H}$ the area of a light spot. In addition, L is a parameter which has the following frequency dependence when the carrier diffusion length is denoted by $L_0$:

$$L = \sqrt{\frac{D\tau}{1 + j2\pi f\tau}} = \frac{L_0}{\sqrt{1 + j2\pi f\tau}} \tag{4}$$

Here, $L_0 = \sqrt{D\tau}$ holds, D denotes the diffusion coefficient of carriers, and $\tau$ denotes the carrier lifetime.

In a case where $\alpha$ is small enough to establish $\alpha L \ll 1$ in Equation (3), $I_{ph} \propto L$ holds, and $I_{ph}$ decreases with the increase of f for $f \gg 1/\tau$ in accordance with Equation (4). Therefore, when the frequency $f = f_0 = \frac{1}{2}\pi\tau$ to establish the condition $2\pi f\tau = 1$ under which $I_{ph}$ begins to decrease is known, conversely the minority carrier lifetime $\tau$ can evaluated.

On the other hand, in case of a p-n junction device or a semiconductor wafer having a strong inversion layer in its surface, Z can be usually approximated to an impedance $Z_j (\omega)$ in which a junction resistance $R_j$ and a junction capacitance $C_j$ are connected in parallel as follows:

$$Z \approx Z_j = \frac{R_j}{1 + j2\pi C_j R_j} \tag{5}$$

Ultimately, the photovoltage $V_{ph}$ is given by the following in this case:

$$V_{ph} = e\Phi(1 - \textcircled{H})\alpha R_j\{1 + (2\pi f C_j R_j)^2\}^{-1/2}\{1 + (2\pi f \tau)^2\}^{-1/4} \tag{6}$$

In general, $\tau < C_j R_j$ holds. It is therefore understood that, as the frequency is raised, the frequency dependence of $V_{ph}$ becomes a constant value for $f < 1/(2\pi C_j R_j)$, $V_{ph} \alpha f^{-1}$ holds for $f > 1/(2\pi C_j R_j)$, and $V_{ph} \alpha f^{-3/2}$ holds for $f > 1/(2\pi\tau)$. Accordingly, in the case of the p-n junction or the semiconductor sample having the strong inversion layer in its surface, it has become possible to obtain $f_0 = 1/(2\pi\tau)$ as the frequency of that point of transition from the $f^{-1}$ dependence to the $f^{-3/2}$ dependence which appears in the frequency dependence of the photovoltage $V_{ph}$.

Figure 1A:
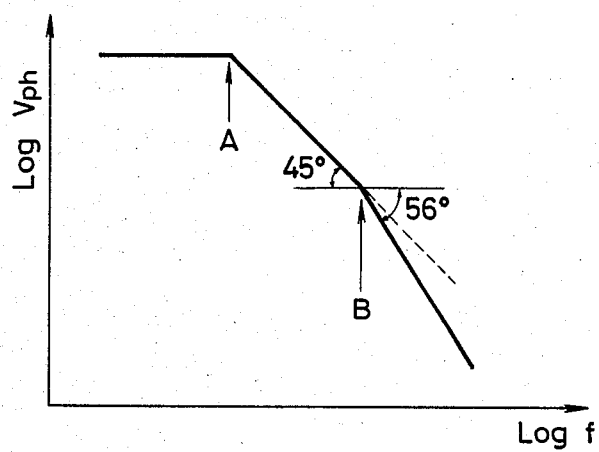
FIGS. 1A and 1B are diagrams for explaining the frequency dependences of photovoltages, in which FIG. 1A corresponds to the absence of the influence of surface states or traps and FIG. 1B the presence thereof.
Figure 1B:
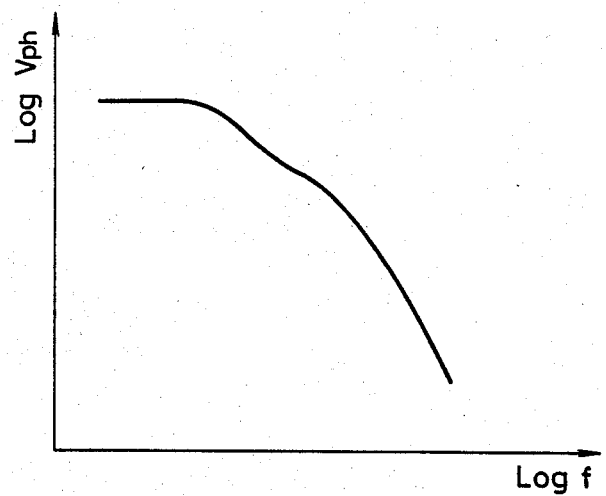

However, as is often observed in cases of forming an oxide film on p-type Si, etc., Z does not become as indicated by Equation (5) in the event that a weak inversion layer or a mere depletion layer exists in an interface or a surface and that interface states or traps or surface states or traps exist in large numbers. In this event, an impedance $Z_{ss}$ in which an equivalent resistance $R_{ss}$ and capacitance $C_{ss}$ based on the surface states or traps are connected in series is incorporated in parallel with $Z_j$ as shown in FIG. 2B. In consequence, the $\omega^{-1}$ dependence no longer develops even for $f > f_c$ as shown in FIG. 1B, and $f_0$ cannot be defined as the frequency at the transition from the $f^{-1}$ dependence to the $f^{-3/2}$ dependence.

Now, going back to the starting point, it is understood that the condition to establish $2\pi f_0 \tau = 1$ appears in the frequency dependence of the photocurrent and is independent of the frequency dependence of Z. As seen from Equation (1), accordingly, when only the frequency dependence of the photocurrent can be measured by any method, the influence of the surface states or traps appearing in the frequency dependence of Z can be eliminated, and the problem can be solved.

With note taken of the photocurrent $I_{ph}$ here, when the optical absorption coefficient $\alpha$ is rendered so large as $\alpha L \gg 1$, it is understood from Equation (3) that $I_{ph} = I_K$ (constant) holds, $I_{ph}$ being independent of the frequency. Accordingly, the photovoltage $V_{ph}'$ in this case is given by the following equation:

$$V_{ph}' = Z \cdot I_K \tag{7}$$

On the other hand, when the photovoltage for $\alpha$ which is so small a $\alpha L \ll 1$ is denoted by $V_{ph}''$ and the photocurrent by $I_{ph}''$, the following equation holds:

$$V_{ph}'' = Z \cdot I_{ph}'' \tag{8}$$

Accordingly, when the ratio between Equation (8) and Equation (7) is taken, the frequency dependence of the photocurrent $I_{ph}''$ is obtained as follows:

(normalized photovoltage ratio: $V_n$)

$$V_n = V_{ph}''/V_{ph}' = (1/I_K) \cdot I_{ph}'' \tag{9}$$

On the basis of this result, only the frequency dependence of the photocurrent can be measured by evaluating the ratio of photovoltages generated by two light sources of a wavelength $\lambda_2$ rendering $\alpha$ so small as $\alpha L \ll 1$ and a wavelength $\lambda_1$ rendering $\alpha$ so large as $\alpha L \gg 1$. Thus, the application of the minority carrier lifetime measurement becomes possible, not only to the p-n junction, but also to various semiconductor samples generating photovoltages.

Figure 3:
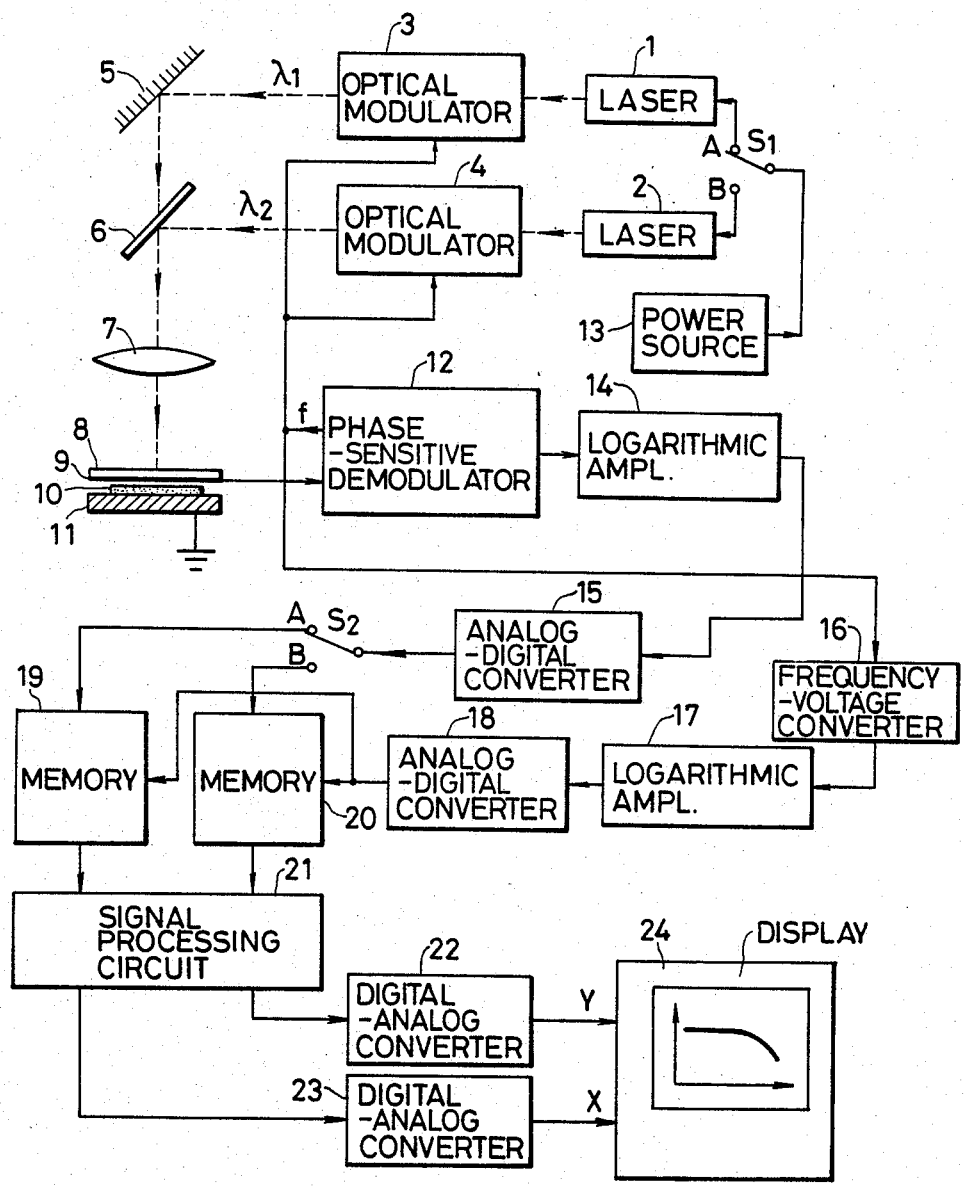
FIG. 3 is a block diagram of an embodiment of the present invention.

Now, an embodiment of the present invention will be described with reference to FIG. 3. In the figure, numeral 1 designates a laser which oscillates at a wavelength $\lambda_1$ of large absorption coefficient $\alpha$, and numeral 2 a laser which oscillates at a wavelength $\lambda_2$ of small absorption coefficient $\alpha$. Numeral 13 designates a laser power source, and the laser 1 or 2 can be selected by changing-over a switch $S_1$ to a side A or a side B. Numerals 3 and 4 indicate optical modulators, which receive the reference signal of a phase-sensitive demodulator 12 as input signals and chop the radiations of the wavelengths $\lambda_1$ and $\lambda_2$ at the frequency f of the reference signal, respectively. By the way, when laser diodes or light emitting diodes (LEDs) are used as the lasers 1 and 2, their driving currents can be directly modulated, so that the optical modulators 3 and 4 are dispensed with and that reduction in the size of the apparatus becomes possible. Shown at numeral 5 is a mirror. Numeral 6 indicates a dichroic mirror, which transmits the radiation of the wavelength $\lambda_1$ and reflects the radiation of the wavelength $\lambda_2$. With these components, the system is adjusted so that, after the light of the wavelength $\lambda_1$ reflected by the mirror 5 and the light of the wavelength $\lambda_2$ from the optical modulator 4 have come out of the dichroic mirror 6, their optical paths may coincide. A sample 10 is placed on a sample holder 11 which is made of metal and which serves also as an electrode. A flat glass plate 8 which is provided with a transparent electrode 9 as an underlying layer is installed over the sample 10 with a spacing of at most 100 $\mu$m therebetween. The light of the wavelength $\lambda_1$ or $\lambda_2$ is condensed on the sample 10 through a lens 7. A generated photovoltage is detected by the phase-sensitive demodulator 12 and is subjected to the logarithmic transform by a logarithmic amplifier 14, whereupon the transformed voltage is digitized by an analog-digital converter 15. On the other hand, the frequency f of the reference signal of the phase-sensitive demodulator 12 is converted into a voltage by an FV (frequency-voltage) converter 16. Thereafter, the voltage is subjected to the logarithmic transform by a logarithmic amplifier 17 and is further digitized by an analog-digital converter 18. The digital output signal of the A/D converter 18 is stored as frequency information in memories 19 and 20. Meanwhile, the digital output signal of the A/D converter 15 is stored in the memory 19 or 20 by being changed-over by means of a switch $S_2$ which interlocks with the switch $S_1$. That is, when the switches $S_1$ and $S_2$ are connected to the A side, data for the wavelength $\lambda_1$ is stored in the memory 19, and when they are connected to the B side, data for the wavelength $\lambda_2$ is stored in the memory 20. Accordingly, the values of Log $V_{ph}$ and Log f are respectively stored as the digital signals in the memories 19 and 20. After the measurement at the wavelengths $\lambda_1$ and $\lambda_2$ has ended, the stored contents are read out from the memories 19 and 20, the difference between Log $V_{ph}$ for $\lambda_1$ and Log $V_{ph}$ for $\lambda_2$ is calculated by a signal processing circuit 21, and a signal analyzed by a digital-analog converter 22 is inputted to the Y-axis of a display unit 24. On the other hand, a digital signal having the information of Log f is analyzed by a digital-analog converter 23, whereupon the analog signal is inputted to the X-axis of the display unit 24. In this way, the characteristic in which Log f is taken on the X-axis and a value proportional to Log $I_{ph}$ is taken on the Y-axis is displayed on the display unit 24. By reading $f_0$ from the display, the minority carrier lifetime $\tau$ can be evaluated from $\tau=1/(2\pi f_0)$.

Figure 4:
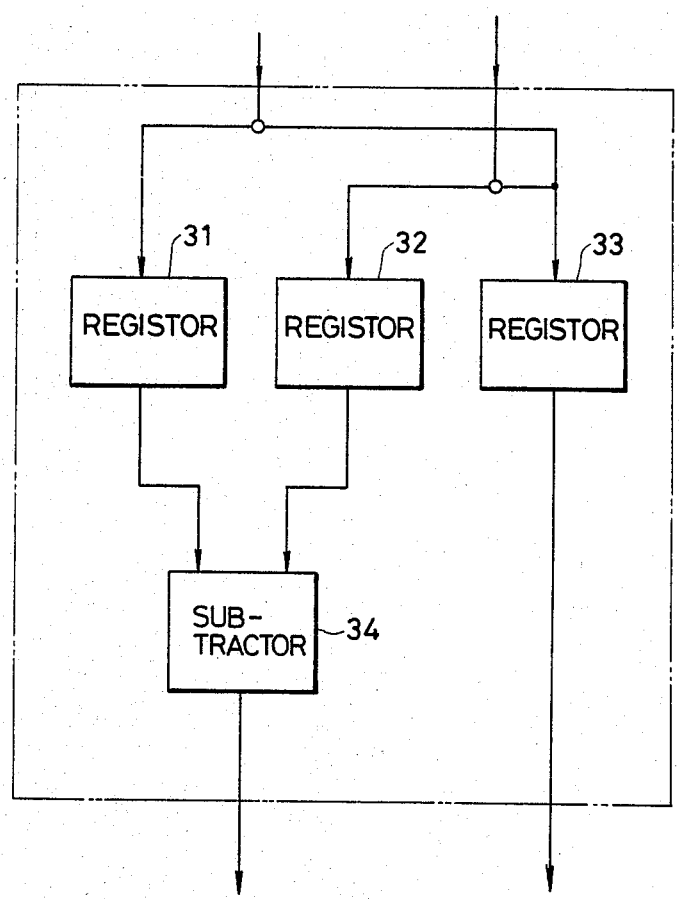
FIG. 4 is a block diagram showing an example of a signal processing circuit in the embodiment of FIG. 3.

FIG. 4 is a block diagram showing a practicable example of the signal processing circuit 21 described above. Among the signals read out from the memories 19 and 20 by address appointment, the signal concerning the frequency is inputted to the D/A converter 23 via a register 33. On the other hand, the signal of the photovoltage concerning $\lambda_1$ is inputted to a subtractor 34 via a register 31, and that concerning $\lambda_2$ is inputted thereto via a register 32. The ratio between the photovoltages based on the two light sources is calculated by the subtractor 34, and is inputted to the D/A converter 22.

Figure 5:
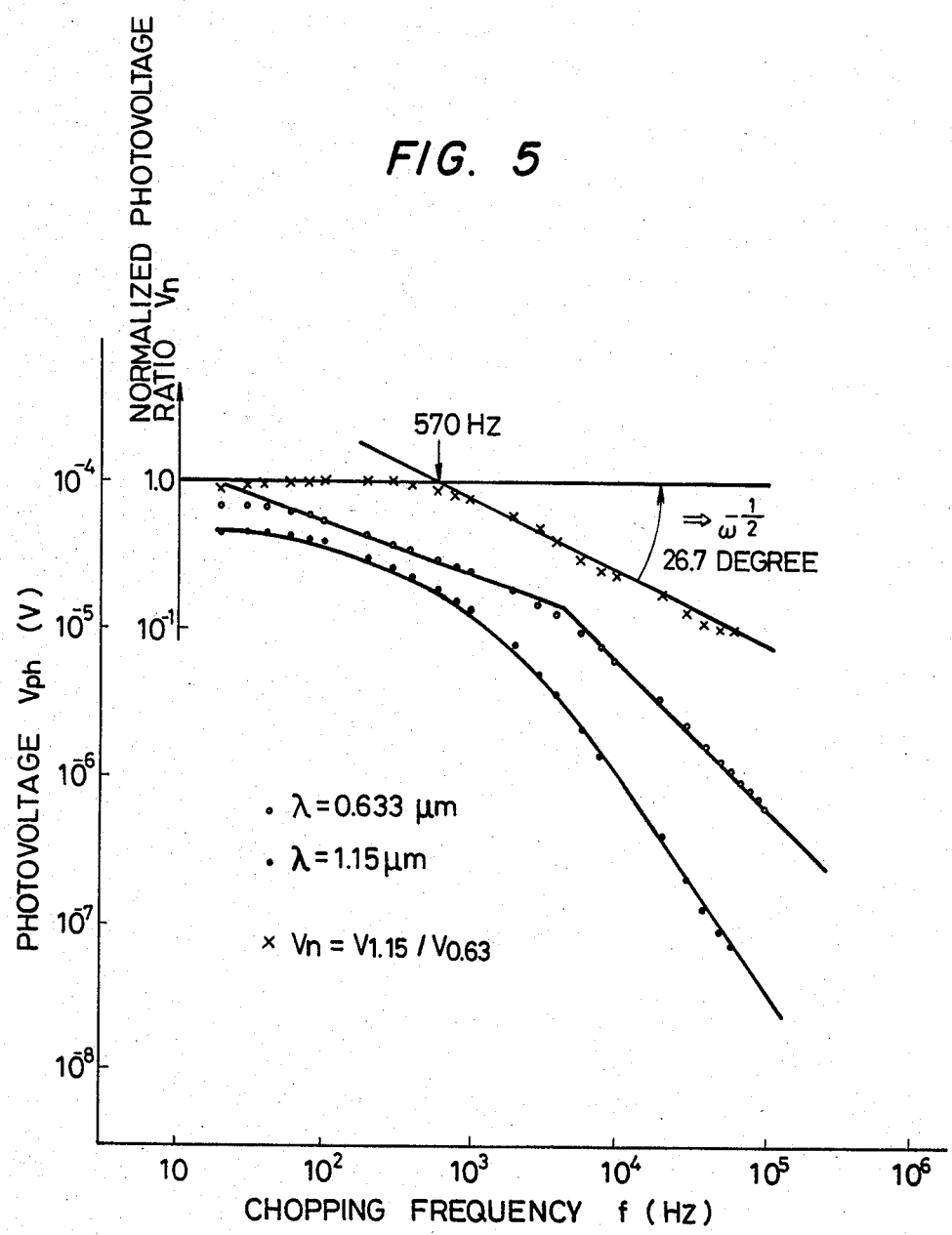
FIG. 5 is a graph showing examples of alkali-treated n-type Si samples actually measured in accordance with the embodiment of FIG. 3.

FIG. 5 shows actual measurement examples. Samples were n-type Si, and each had dimensions of 5 mm×5 mm×56 mm. Light entered one of the planes of 5 mm×56 mm. A He-Ne laser beam oscillating at $\lambda_2=1.15$ $\mu$m was used as the light of the wavelength of small absorption coefficient $\alpha$, while a He-Ne laser beam at $\lambda_1=0.633$ $\mu$m was used as the light of the wavelength of large absorption coefficient $\alpha$. Black circles in FIG. 5 are results at the wavelength $\lambda_2$. When only the results of the black circles are employed, the $f^{-1}$ dependence does not appear even for frequencies exceeding the cutoff frequency, and the bending point which gives the minority carrier lifetime is quite unknown. Therefore, a curve indicated by white circles which are results measured with the light of $\lambda_1=0.633$ $\mu$m is also employed, and the ratios of the results at $\lambda_2=1.15$ $\mu$m and $\lambda_1=0.633$ $\mu$m are taken and then normalized by the maximum value. Results thus obtained are a curve indicated by marks X. From this curve, it is seen that the characteristic is flat when the frequency f is not higher than 570 Hz, whereas it is slant in proportion to $\omega^{-\frac{1}{2}}$ in a region which exceeds 570 Hz. This characteristic demonstrates the very frequency dependence of the photocurrent. In view of this characteristic, the frequency $f_0$ is 570 Hz. Accordingly, a value of 280 $\mu$s is obtained as the minority carrier lifetime $\tau$.

As set forth above, according to the present invention, the frequency dependence of a photocurrent included in the frequency dependence of a photovoltage can be measured without being affected by interface states or traps or surface states or traps. This demonstrates the very remarkable effect that the absolute value of a minority carrier lifetime can be measured from the frequency of a bending point appearing in the frequency dependence of the photocurrent, without regard to the types of photovoltage generation such as a p-n junction and p-type Si bearing an oxide film. In addition, since the influences of fluctuations attendant upon the setting of a sample, e.g., a coupling capacitance $C_m$ are removed, a measurement of high reliability is possible, and the measurement is non-contacting and nondestructive.

What is claimed is:

1. A carrier lifetime measuring apparatus comprising:
   a sample holder on which a semiconductor sample having a potential barrier in the vicinity of its surface is placed,
   a first light source which generates a photon beam whose wavelength is so long that the value of $\alpha L$ is smaller than 1 and the values of Iph and L hold a proportional relation to each other wherein $\alpha$ denotes the optical absorption coefficient, Iph denotes a photocurrent, and L is expressed by $L_0/\sqrt{1+j2\pi f\tau}$ in which $L_0$ denotes the carrier diffusion length, f the frequency of chopping the light and $\tau$ the carrier lifetime,
   a second light source which generates a photon beam whose wavelength is so short that the value of $\alpha L$ is greater than 1 and the value of Iph holds constant, means for chopping the respective photon beams, means for irradiating an identical place of the semiconductor sample alternately with the chopped photon beams, means for detecting first and second photovoltages generated in the semiconductor sample by the photon beam irradiation, through capacitance coupling, and signal processing means for evaluating a ratio between a first amplitude value and a second amplitude value from amplitudes of first and second photovoltages detected by the means for detecting first and second photovoltages, thereby to calculate a minority carrier lifetime at the photon beam irradiation position of the semiconductor sample.

2. A carrier lifetime measuring apparatus according to claim 1, wherein said photon beam wavelength of said first light source is at least 1.15 μm and that of said second light source is no greater than 0.633 μm.

* * * * *